(12) United States Patent
Mukhopadhyay et al.

(10) Patent No.: US 9,270,273 B2
(45) Date of Patent: Feb. 23, 2016

(54) LEVEL SHIFTER

(75) Inventors: Rajarshi Mukhopadhyay, Allen, TX (US); Paul M. Emerson, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/284,511

(22) Filed: Oct. 28, 2011

(65) Prior Publication Data

US 2013/0106485 A1 May 2, 2013

(51) Int. Cl.
*H03L 5/00* (2006.01)
*H03K 19/0175* (2006.01)
*H03K 19/0185* (2006.01)

(52) U.S. Cl.
CPC ............... *H03K 19/017509* (2013.01); *H03K 19/018507* (2013.01)

(58) Field of Classification Search
USPC .............. 327/333, 284, 172, 175; 326/62–92
See application file for complete search history.

(56) References Cited

U.S. PATENT DOCUMENTS

| | | | |
|---|---|---|---|
| 4,496,857 A | 1/1985 | Chao | |
| 4,504,747 A | 3/1985 | Smith et al. | |
| 5,986,472 A | 11/1999 | Hinedi et al. | |
| 6,784,727 B1 * | 8/2004 | Cao et al. | 327/553 |
| 6,972,588 B1 * | 12/2005 | Wong et al. | 326/26 |
| 7,176,720 B1 * | 2/2007 | Prather et al. | 326/80 |
| 7,315,182 B2 * | 1/2008 | Payne et al. | 326/22 |
| 7,394,283 B2 * | 7/2008 | Hsu et al. | 326/32 |
| 7,495,491 B2 * | 2/2009 | Wu | 327/175 |
| 2005/0219192 A1 | 10/2005 | Fujikawa | |
| 2006/0091907 A1 | 5/2006 | Khan | |
| 2007/0001716 A1 | 1/2007 | Sanchez et al. | |

OTHER PUBLICATIONS

"High-Voltage Power Delivery Through Charge Recycling," IEEE Journal of Solid-State Circuits, vol. 41, No. 6, Jun. 2006, pp. 1400-1410 (Rajapandian, et al.).
"Monolithic Capacitive DC-DC Converter With Single Boundary—Multiphase Control and Voltage Domain Stacking in 90 nm CMOS," IEEE Journal of Solid-State Circuits, vol. 46, No. 7, Jul. 2011, pp. 1715-1727 (Breussegem, et al.).
PCT Search Report mailed Mar. 11, 2013.

* cited by examiner

*Primary Examiner* — Lincoln Donovan
*Assistant Examiner* — Thomas Skibinski
(74) *Attorney, Agent, or Firm* — John R. Pessetto; Frank D. Cimino

(57) ABSTRACT

A level shifter is provided. This level shifter includes a first driver, a second driver, a capacitor, and a common mode circuit. The first driver has a first signal path that is coupled between an input terminal and an output terminal, and the first driver operates in a first voltage domain. The second operates in a second voltage domain and includes a second signal path and latch. The second signal path is coupled between an input terminal and an output terminal of the second driver, and the latch that is coupled to the input terminal of the second signal path. The capacitor that is coupled between the output terminal of the first signal path and the input terminal of the second signal path, and the bias circuit is coupled to the input terminal of the second signal path and operates in the second voltage domain.

15 Claims, 6 Drawing Sheets

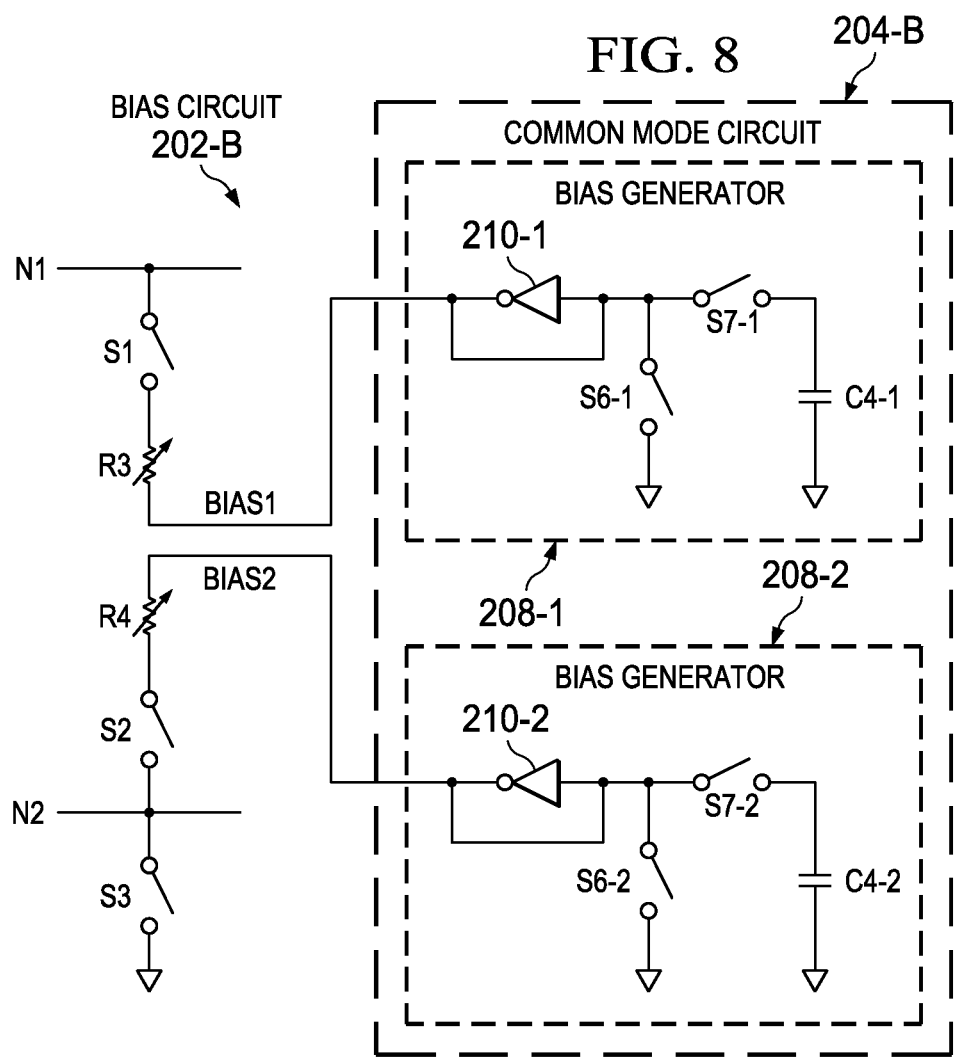

LEVEL SHIFTER

TECHNICAL FIELD

The invention relates generally to level shifting and, more particularly, to a level shifter with low jitter.

BACKGROUND

Turning to FIG. 1, a conventional level shifter 100 can be seen. Level shifter 100 is generally comprised of drivers 102 and 104 (which operate in different voltage domains) with capacitors C1 and C2 (which should be sufficiently large so as to have a sufficiently low cut-off frequency) coupled therebetween. For higher voltage applications, capacitors C1 and C2 can be replaced with capacitor strings. Typically, each of drivers 102 and 104 has a pair of signal or data paths (which are generally comprised of inverters 106-1 to 106-4 and 108-1 to 108-4) so as to be able to generate differential signal DOUT/$\overline{\text{DOUT}}$ from differential signal DIN/$\overline{\text{DIN}}$. Latch 110 (which is coupled between the signals paths of driver 104 and which are generally comprised of inverters 108-5 and 108-6) is also included to drive the signal to rail.

A problem with this arrangement, however, is that, as switching occurs, capacitors C1 and C2 are repeatedly charged and discharged. As a result, the voltage on the capacitors C1 and C2 varies, distorting the signal DIN/$\overline{\text{DIN}}$ as it traverses the level shifter 100 (as shown in FIG. 2). Additionally, jitter is introduced, which distorts the eye-opening pattern (as shown in FIG. 3). Thus, there is a need to compensate for distortion in level shifters.

Some other examples of conventional systems are: U.S. Patent Pre-Grant Publ. No. 2006/0091907; Rajapandian et al., "High-voltage power delivery through charge recycling," *IEEE J. of Solid-State Circuits*, Vol. 41, No. 6, pp. 1400-1410, June 2006; and Breussegem et al., "Monolithic capactivie DC-DC Converter with Single Boundary-Multiphase Control and Voltage Domain Stacking in 90 nm CMOS," *IEEE J. of Solid-State Circuits*, Vol. 46, No. 7, pp. 1715-1727, July 2011.

SUMMARY

An embodiment of the present invention, accordingly, provides an apparatus. The apparatus comprises a first driver having a first signal path with an input terminal and an output terminal, wherein the first driver operates in a first voltage domain, and wherein the input terminal of the first signal path receives an input signal; a second driver that operates in a second voltage domain, wherein the second driver has: a second signal path with an input terminal and an output terminal; and a latch that is coupled to the input terminal of the second signal path; a capacitor that is coupled between the output terminal of the first signal path and the input terminal of the second signal path; and a bias circuit that is coupled to the input terminal of the second signal path and that operates in the second voltage domain.

In accordance with an embodiment of the present invention, the second signal path further comprises a plurality of inverters coupled in series with one another in a sequence between the input and output terminals of the second signal path.

In accordance with an embodiment of the present invention, the capacitor further comprises a first capacitor, and wherein the bias circuit further comprises: a resistor that is coupled to the input terminal of the second signal path; a second capacitor; and a common mode inverter that is coupled between the second capacitor and the resistor.

In accordance with an embodiment of the present invention, the common mode inverter is a replica of the first inverter of the sequence.

In accordance with an embodiment of the present invention, the input signal is differential, and wherein the first driver further comprises a third signal path with an input terminal and an output terminal.

In accordance with an embodiment of the present invention, the resistor further comprises a first resistor, and wherein the second driver further comprises a fourth signal path with an input terminal and an output terminal, and wherein the latch and a second resistor are coupled to the input terminal of the fourth signal path, and wherein the apparatus further comprises a third capacitor that is coupled between the output terminal of the third signal path and the input terminal of the fourth signal path.

In accordance with an embodiment of the present invention, the first and second resistors are coupled together.

In accordance with an embodiment of the present invention, the common mode inverter further comprises a first common mode inverter, and wherein the bias circuit further comprises: a fourth capacitor; and a second common mode inverter that is coupled between the second fourth and the second resistor.

In accordance with an embodiment of the present invention, the first and second resistors are adjustable.

In accordance with an embodiment of the present invention, an apparatus is provided. The apparatus comprises a first driver that operates in a first voltage domain, wherein the first driver has: a first input terminal; a first output terminal; and a first set of inverters coupled in series with one another between the first input terminal and the first output terminal; a second driver that operates in a second voltage domain, wherein the second driver has: a second input terminal; a second output terminal; a second set of inverters coupled in series with one another between the second input terminal and the second output terminal; and a latch that is coupled to the second input terminal; a capacitor that is coupled between the first output terminal and the second input terminal; and a bias circuit that is coupled to the second input terminal and that operates in the second voltage domain.

In accordance with an embodiment of the present invention, the second set of inverters are coupled in series with one another in a sequence, and wherein the capacitor further comprises a first capacitor, and wherein the common mode circuit further comprises: a resistor that is coupled to the second input terminal; a second capacitor; and a common mode inverter that is coupled between the second capacitor and the resistor.

In accordance with an embodiment of the present invention, the common mode inverter is a replica of the first inverter of the sequence.

In accordance with an embodiment of the present invention, the first driver further comprises: a third input terminal; a third output terminal; and a third set of inverters coupled in series with one another between the third input terminal and the third output terminal.

In accordance with an embodiment of the present invention, the resistor further comprises a first resistor, and wherein the bias circuit further comprises second resistor, and wherein the second driver further comprises: a fourth input terminal; a fourth output terminal that is coupled to the latch and the second resistor; and a fourth set of inverters coupled in series with one another between the fourth input terminal and the fourth output terminal.

In accordance with an embodiment of the present invention, the apparatus further comprises a third capacitor that is coupled between the third output terminal and the fourth input terminal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5 and 8 are diagrams of examples of the bias circuit of FIG. 4;

DETAILED DESCRIPTION

Figure 1:
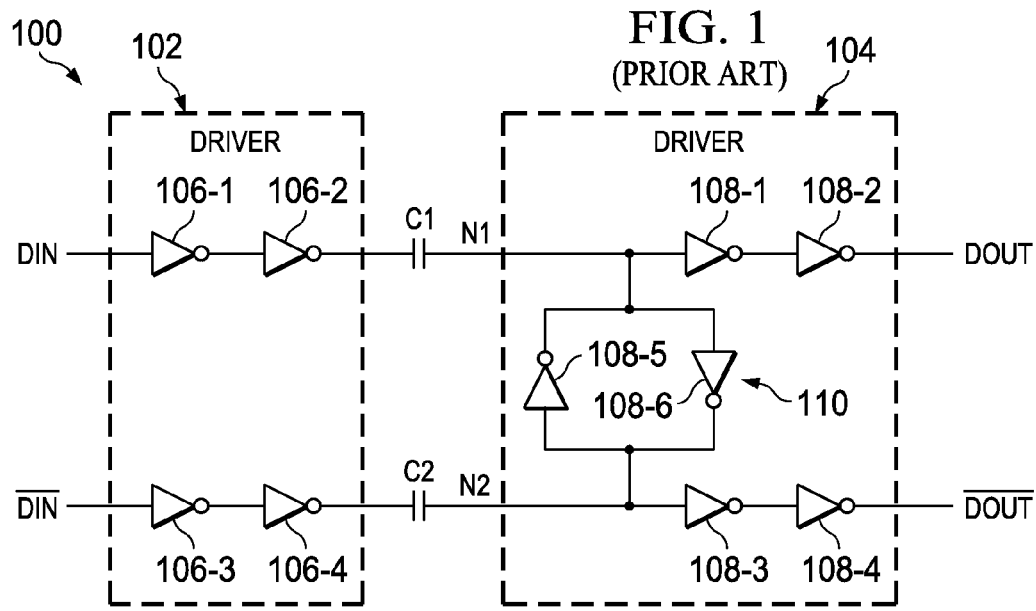
FIG. 1 is a diagram of an example of a conventional level shifter.
Figure 3:
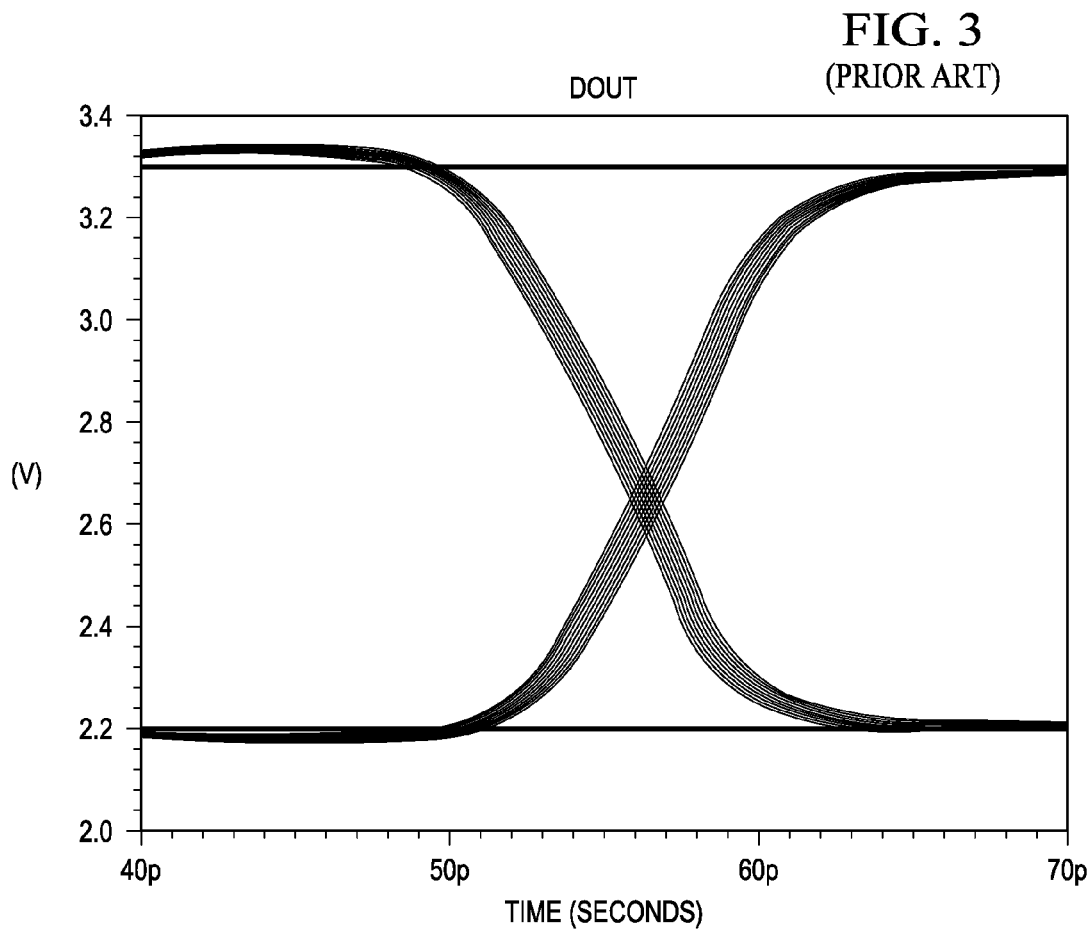
FIG. 3 is a diagram depicting an eye-opening for the level shifter of FIG. 1.
Figure 2:
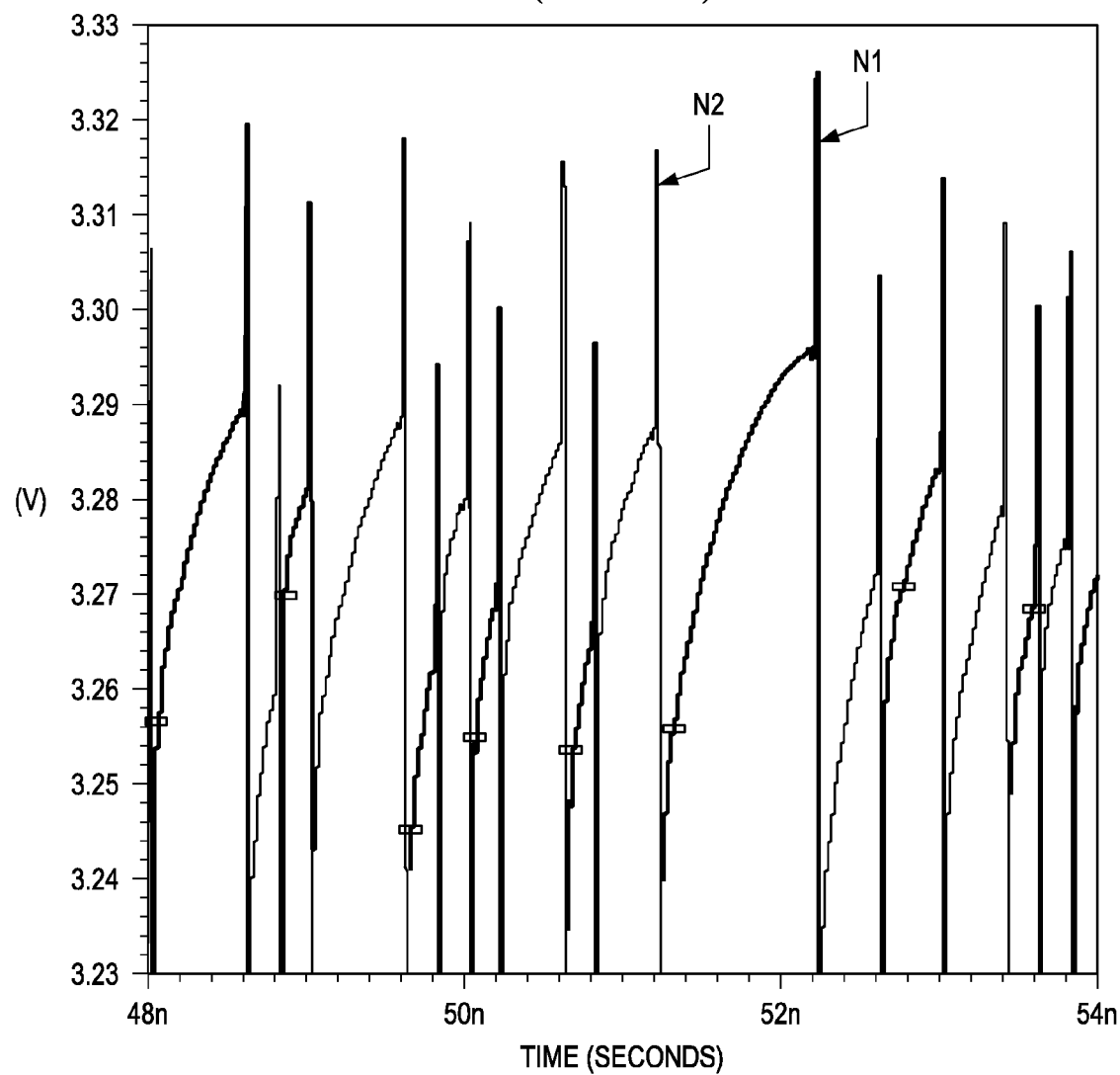
FIG. 2 is a diagram depicting the transient response for the level shifter of FIG. 1.

Refer now to the drawings wherein depicted elements are, for the sake of clarity, not necessarily shown to scale and wherein like or similar elements are designated by the same reference numeral through the several views.

Figure 4:
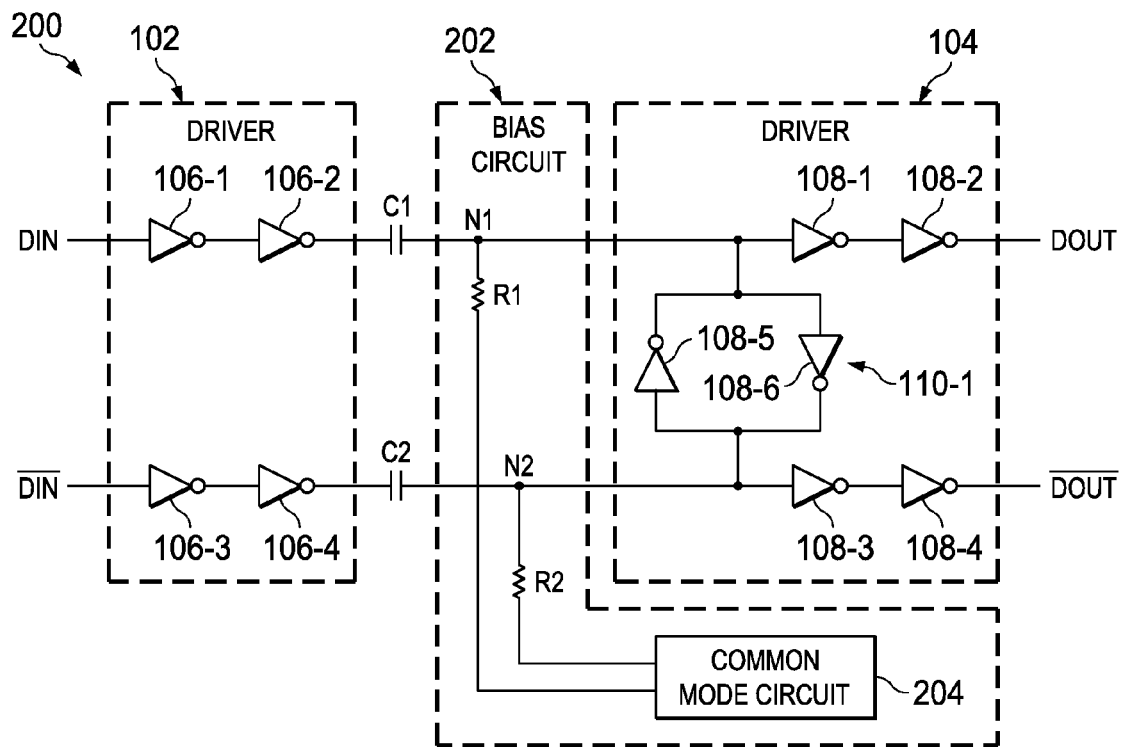
FIG. 4 is a diagram of an example of a level shifter in accordance with an embodiment of the present invention.

Turning to FIG. 4, an example of a level shifter 200 in accordance with an embodiment of the present invention can be seen. As shown, the level shifter 200 is similar in construction to level shifter 100, except that level shifter 200 includes a bias circuit 202. This bias circuit 202 (which operates in the same voltage domain as driver 104) generally includes resistors R1 and R2 that are coupled to the signal paths of driver 104, and a common mode circuit 204. The common mode circuit 204 generates common mode voltage(s) that can be used to substantially maintain the voltages on capacitors C1 and C2. Each of inverters 106-1 to 106-4, 108-1 to 108-6, and 204 are also comprised of a PMOS transistor and an NMOS transistor, and resistors R1 and R2 can have generally the same value or resistance. Additionally, as shown, level shifter 200 is differential, but level shifter 200 can also be used with a single-ended signal (where the data paths that include inverters 106-3, 106-4, 108-3 and 108-4 and capacitor C2 are omitted).

Figure 5:
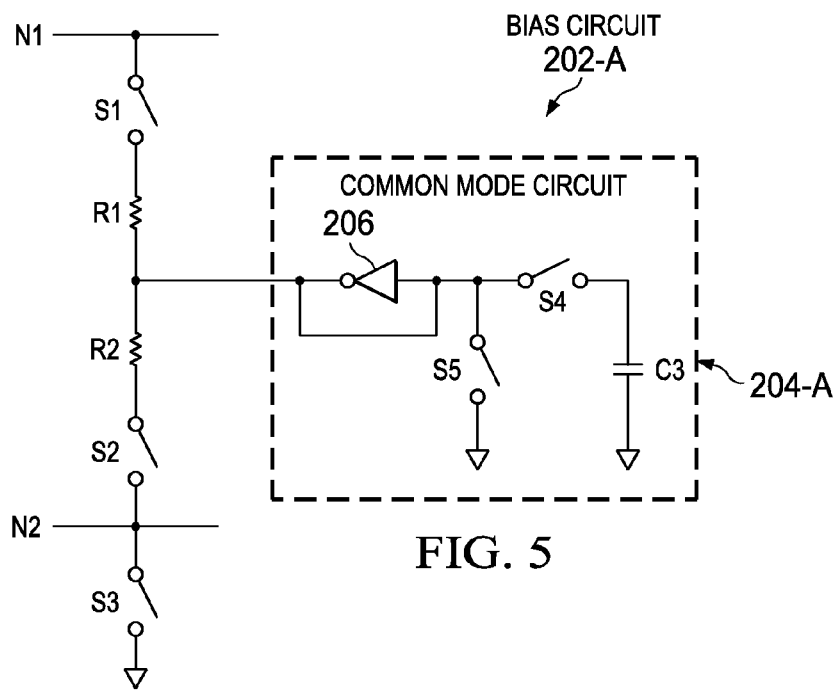

In FIG. 5, a more detailed example of the bias circuit 202 (labeled 202-A for FIG. 5) can be seen. As shown, the resistors R1 and R2 are coupled together to form a divider between the signals paths of driver 104, and the common mode circuit 204-A generally includes a common mode inverter 204 and capacitor C3. Typically, the inverters 108-1 to 108-4 are matched (meaning that transistors of the same sizes are employed), and common mode inverter 204 (which generally operates in the same voltage domain as driver 104) is typically a replica of inverter 108-1 (meaning that the transistors of 204 are scaled in comparison to inverter 108-1). Being a replica, the current used by inverter 204 is lower.

Figure 6:
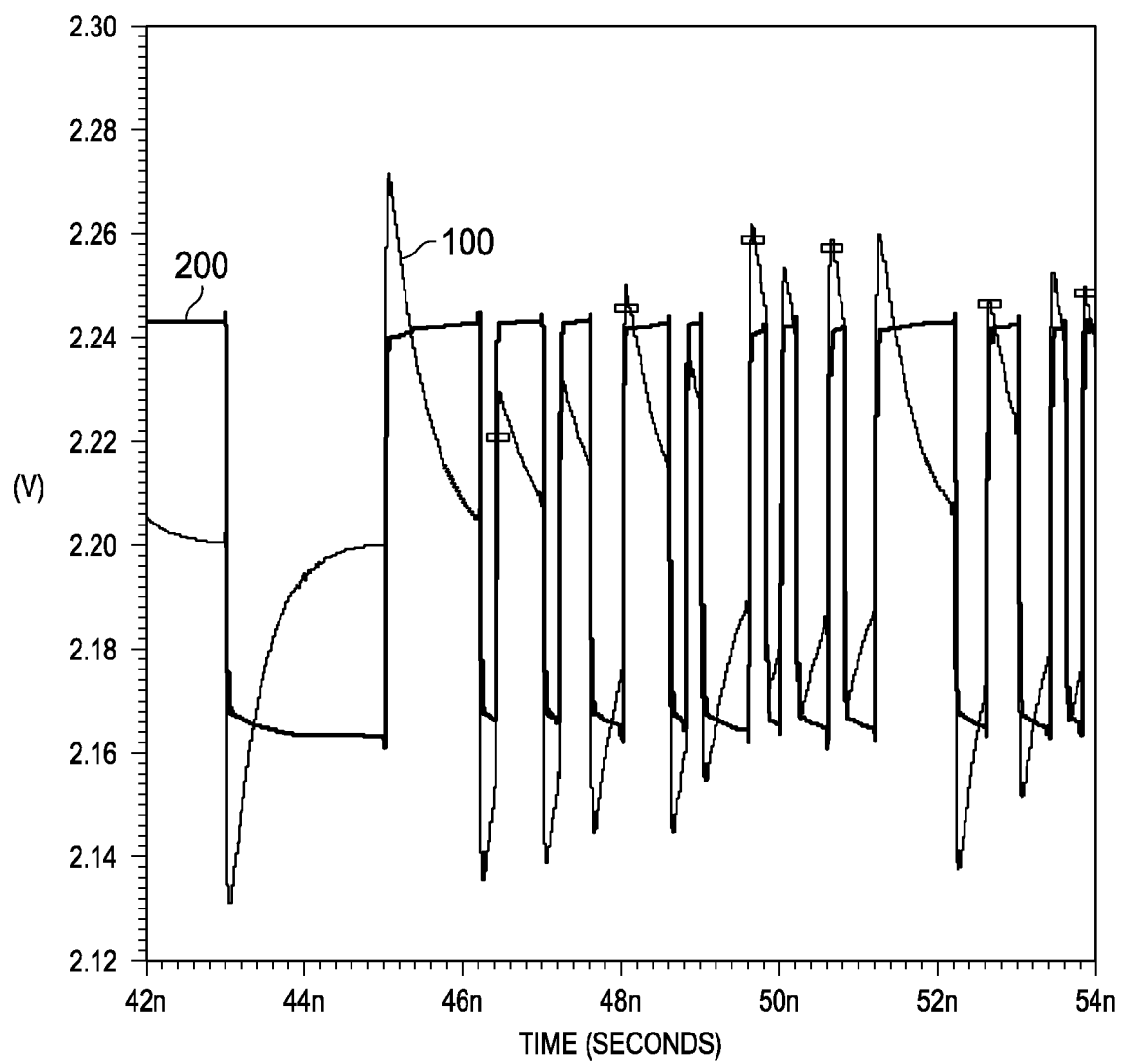
FIG. 6 is a diagram comparing the transient responses for the level shifters of FIGS. 1 and 4.
Figure 7:
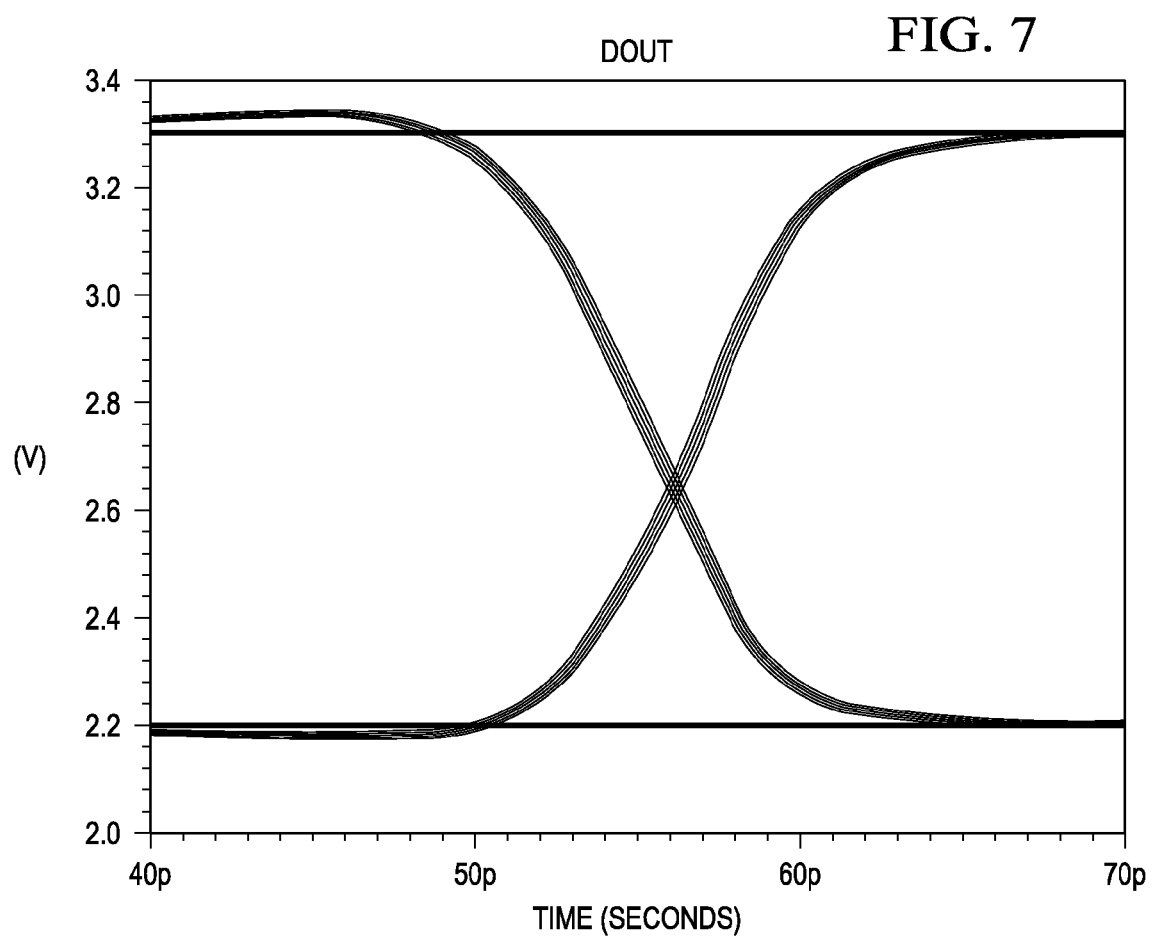
FIG. 7 is a diagram depicting an eye-opening for the level shifter of FIG. 4.

As mentioned above, using this bias circuit 202-A, the voltages on the capacitors C1 and C2 can be generally maintained; this is usually accomplished by forming additional current paths with the bias circuit 202-A during switching. As an example, it can be assumed that the voltage on node N1 transitions to logic low and the voltage on node N2 transitions to logic high. When the voltage at node N2 becomes sufficiently large, the voltage on node N1 becomes sufficiently small, and neither has railed, the NMOS transistor for inverter 108-5 and the PMOS transistor for inverter 108-6 enter into a linear region. At this point, the common mode circuit 202 forms a current path that limits the amplitude (A) of the of the voltage swing to:

$$VSS + IR_{ONNMOS} \leq A \leq VDD - IR_{ONPMOS}, \quad (1)$$

where VDD and VSS are the rail voltages for the domain of the driver 104 and bias circuit 202-A. A current path would also be formed similarly for a transition in the opposite direction. Additionally, the PMOS and NMOS transistors for inverters 108-5 and 108-6 along with the resistors R1 and R2 should also be sized such that the PMOS and NMOS transistors for inverters 108-5 and 108-6 do not enter a deep linear region (i.e., drain-source voltage $V_{DS}$ is less than about 50 mV). As a result of employing the bias circuit 202-A, the amplitude of the voltage swing seen by capacitors C1 and C2 is small, meaning that the voltage on capacitors C1 and C2 is substantially maintained. Thus, signal integrity is improved where signal distortion is reduced (as shown in FIG. 6) and where jitter is reduced (as shown in FIG. 7).

Bias circuit 202-A also includes switches S1 to S5 to allow the bias circuit 202-A and level shifter 200 to be deactivated. Switches S1 to S5 are usually controlled by an enable signal such that switches S1, S2, and S4 are closed when the enable signal is logic high or "1" and switches S3 and S5 are closed when the enable signal is logic low or "0." By having this arrangement, switch S5 drives the common mode voltage to ground, and switch S3 drives node N2 to ground, allowing the latch (inverters 108-5 and 108-6) to drive node N1 to rail VDD. Thus, when deactivated, there is little to no quiescent current in level shifter 200.

Turning to FIG. 8, another example of the bias circuit 202 (labeled 202-B for FIG. 8) can be seen. Similar to bias circuit 202-A, bias circuit 202-B includes resistors R3 and R4 and switches S1 to S3, but common mode circuit 204-B generates bias voltages BIAS1 and BIAS2 for each of resistors R3 and R4, respectively, from bias generators 208-1 and 208-2. These bias generators 208-1 and 208-2 use common mode inverters 210-1 and 210-2 (which are replicas of inverters 108-1 and 108-3, respectively, and which operate in a similar manner to inverter 206) and capacitors C4-1 and C4-2 (which operate in a similar manner to capacitor C3) to generate these bias voltages BIAS1 and BIAS2. Additionally, the resistors R3 and R4 are adjustable (which can, for example, be a switched resistor array) so as to "tune" the common mode voltage to compensate for variances in the data paths of driver 104. Bias generators 208-1 and 208-2 also include switches S6-1, S6-2, S7-1, and S7-2 that operate in a similar manner to switches S4 and S5 to lower the quiescent current in driver 200.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a first driver having a first signal path with an input terminal and an output terminal, wherein the first driver includes a means for operating in a first voltage domain, and wherein the input terminal of the first signal path receives an input signal;
a second driver that operates in a second voltage domain, wherein the second driver includes
a second signal path with an input terminal and an output terminal, and
a latch that is coupled to the input terminal of the second signal path;
a first capacitor coupled between the output terminal of the first signal path and the input terminal of the second signal path via a first node,
wherein the input signal is differential, and
wherein the first driver further comprises a third signal path with an input terminal and an output terminal, and
wherein the second driver further comprises a fourth signal path with an input terminal and an output terminal;
a second capacitor coupled between the output terminal of the third signal path and the input terminal of the fourth signal path via a second node; and
a bias circuit coupled between the first node and the second node, the bias circuit operates in the second voltage domain,
wherein the bias circuit is coupled through a first resistor and a second resistor to the first and the second nodes respectively,
wherein the first and second resistors have a resistance sufficient to block substantially all high frequency leakage to ground through a bias capacitor of the bias circuit but allow low frequency bias to add to the high frequency signals,
wherein the latch is coupled between the second and fourth signal paths, and
wherein the second signal path further comprises a plurality of inverters coupled in series with one another in a sequence between the input and output terminals of the second signal path.

2. The apparatus of claim 1, wherein the bias circuit further comprises:
a third capacitor; and
a common mode inverter that is coupled to the third capacitor.

3. The apparatus of claim 2, wherein the common mode inverter is a replica of a first inverter of the sequence.

4. The apparatus of claim 3, wherein the common mode inverter further comprises a first common mode inverter, and wherein the bias circuit further comprises:
a fourth capacitor; and
a second common mode inverter that is coupled to the fourth capacitor.

5. The apparatus of claim 4, wherein the first and second resistors are adjustable.

6. The apparatus of claim wherein the first and second resistors are coupled together.

7. The apparatus of claim 1, wherein the latch comprises two cross-coupled inverters.

8. An apparatus comprising:
a first driver that operates in a first voltage domain, wherein the first driver has:
a first input terminal;
a first output terminal; and
a first set of inverters coupled in series with one another between the first input terminal and the first output terminal;
a second driver that operates in a second voltage domain, wherein the second driver has:
a second input terminal;
a second output terminal;
a second set of inverters coupled in series with one another between the second input terminal and the second output terminal; and
a latch that is coupled to the second input terminal;
a first capacitor that is coupled between the first output terminal and the second input terminal via a first node; and
a bias circuit that is coupled to the second input terminal and that includes a means for operating in the second voltage domain,
wherein the first driver is configured to receive an input signal that is differential;
wherein the first driver further comprises a first signal path and a third signal path each with an input terminal and an output terminal, and
wherein the second driver further comprises a second signal path and a fourth signal path with an input terminal and an output terminal, and
a second capacitor that is coupled between the output terminal of the third signal path and the input terminal of the fourth signal path via a second node; and
wherein the bias circuit is further coupled to the input terminal of the second signal path via the first node and the fourth signal path via the second node and that operates in the second voltage domain,
wherein the bias circuit is coupled through a first resistor and a second resistor via the first node and the second node, respectively,
wherein the first and second resistors have a resistance sufficient to block substantially all high frequency leakage to ground through a bias capacitor of the bias circuit but allow low frequency bias to add to the high frequency signal;
wherein the second signal path further comprises a plurality of inverters coupled in series with one another in a sequence between the input and output terminals of the second signal path; and
wherein the latch is coupled between the second and fourth signal paths, respectively wherein the second set of inverters are coupled in series with one another in a sequence, and wherein the bias circuit further comprises:
a fourth capacitor; and
a common mode inverter that is coupled to the fourth capacitor.

9. The apparatus of claim 8, wherein the common mode inverter is a replica of the first inverter of the sequence.

10. The apparatus of claim 9, wherein the first driver further comprises:

a third input terminal;
a third output terminal; and
a third set of inverters coupled in series with one another between the third input terminal and the third output terminal.

11. The apparatus of claim 10, wherein the second driver further comprises:
a fourth input terminal that is coupled to the latch and the second resistor; and
a fourth set of inverters coupled in series with one another between the fourth input terminal and the fourth output terminal.

12. The apparatus of claim 11, wherein the first and second resistors are coupled together.

13. The apparatus of claim 11, wherein the common mode inverter further comprises a first common mode inverter, and wherein the bias circuit further comprises:
a second common mode inverter that is coupled to the fourth capacitor.

14. The apparatus of claim 13, wherein the first and second resistors are adjustable.

15. The apparatus of claim 8, wherein the latch comprises two cross-coupled inverters.

* * * * *